US009530645B2

(12) United States Patent
Muramatsu et al.

(10) Patent No.: US 9,530,645 B2
(45) Date of Patent: Dec. 27, 2016

(54) PATTERN FORMING METHOD, PATTERN FORMING APPARATUS, AND NON-TRANSITORY COMPUTER-READABLE STORAGE MEDIUM

(71) Applicant: Tokyo Electron Limited, Tokyo (JP)

(72) Inventors: Makoto Muramatsu, Koshi (JP);
Takahiro Kitano, Koshi (JP);
Tadatoshi Tomita, Koshi (JP); Keiji Tanouchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 23 days.

(21) Appl. No.: 14/395,158

(22) PCT Filed: Apr. 15, 2013

(86) PCT No.: PCT/JP2013/061177
§ 371 (c)(1),
(2) Date: Oct. 17, 2014

(87) PCT Pub. No.: WO2013/161605
PCT Pub. Date: Oct. 31, 2013

(65) Prior Publication Data
US 2015/0072536 A1 Mar. 12, 2015

(30) Foreign Application Priority Data
Apr. 24, 2012 (JP) ................. 2012-099223

(51) Int. Cl.
G03F 7/26 (2006.01)
H01L 21/027 (2006.01)
G03F 7/40 (2006.01)
G03F 7/00 (2006.01)
G03F 7/16 (2006.01)
B81C 1/00 (2006.01)
H01L 21/67 (2006.01)
H01L 21/3105 (2006.01)
H01L 21/311 (2006.01)

(52) U.S. Cl.
CPC ....... *H01L 21/0274* (2013.01); *B81C 1/00031* (2013.01); *G03F 7/0002* (2013.01); *G03F 7/0035* (2013.01); *G03F 7/16* (2013.01); *G03F 7/168* (2013.01); *G03F 7/40* (2013.01); *G03F 7/405* (2013.01); *H01L 21/0271* (2013.01); *H01L 21/0273* (2013.01); *H01L 21/31058* (2013.01); *H01L 21/31133* (2013.01); *H01L 21/31138* (2013.01); *H01L 21/6708* (2013.01); *H01L 21/6715* (2013.01); *H01L 21/67051* (2013.01); *H01L 21/67115* (2013.01); *B81C 2201/0149* (2013.01)

(58) Field of Classification Search
CPC ....................................... G03F 7/26
See application file for complete search history.

(56) References Cited

U.S. PATENT DOCUMENTS

2008/0293183 A1* 11/2008 Tsukamoto ............. H01L 45/06
438/102
2012/0238109 A1* 9/2012 Hattori .................. G03F 7/0046
438/780
2013/0312659 A1* 11/2013 Inatomi ..................... G03F 7/40
118/66

FOREIGN PATENT DOCUMENTS

| JP | H11-295903 A | 10/1999 |
| JP | 2004-235468 A | 8/2004 |
| JP | 2005-29779 A | 2/2005 |
| JP | 2006-80277 A | 3/2006 |
| JP | 2007-125699 A | 5/2007 |
| JP | 2008-036491 A | 2/2008 |
| JP | 2011-18778 A | 1/2011 |
| JP | 2011-257499 A | 12/2011 |
| WO | 2012/111694 A1 | 8/2012 |

OTHER PUBLICATIONS

R. Tiron et al., Pattern density multiplication by direct self assembly of block copolymers: Towards 300nm CMOS requirements, Proccedings of SPIE, Feb. 2, 2012, 8323, 832300-1.
Joy Y. Cheng et al., Simple and Versatile Methods to Integrate Directed Self-Assembly with Optical Lithography Using a Polarity-Switched Photoresist, ACS nano, Aug. 24, 2010, 4 (8), 4815.
K.W. Guarini, et al., "Optimization of Diblock Copolymer Thin Film Self Assembly", Advanced Materials, 2002, 14, No. 18, Sep. 16, pp. 1290-1294 (p. 1290, 11.31-51).
Daniel R Sanders et al., "Integration of Directed Self-Assembly with 193 nm Lithography", Journal of Photopolymer Science and Technology, Jul. 16, 2010, pp. 11-18, vol. 23, No. 1, Japan.

\* cited by examiner

*Primary Examiner* — Kathleen Duda
(74) *Attorney, Agent, or Firm* — Posz Law Group, PLC

(57) ABSTRACT

A photoresist pattern used for forming a pattern of a block copolymer is formed on a substrate, and then an acid solution is supplied and an alkaline solution is further supplied to the photoresist pattern so as to slim and smooth the photoresist pattern. A block copolymer solution is applied to the substrate on which the smoothed photoresist pattern has been formed, to form a film of the block copolymer, and the film is heated.

8 Claims, 13 Drawing Sheets (i)

(j)

(a)

(b)

(c)

(d)

(a)

(b)

(c)

PATTERN FORMING METHOD, PATTERN FORMING APPARATUS, AND NON-TRANSITORY COMPUTER-READABLE STORAGE MEDIUM

TECHNICAL FIELD

The present invention relates to a directed self-assembly (DSA) lithography technique, and relates to a pattern forming method, a pattern forming apparatus and a computer-readable storage medium storing a computer program causing the pattern forming apparatus to perform the pattern forming method, each using the technique.

This application is based upon and claims the benefit of priority of the prior Japanese Patent Application No. 2012-099223, filed in Japan on Apr. 24, 2012, the entire contents of which are incorporated herein by reference.

BACKGROUND ART

The practical use of the directed self-assembly lithography technique utilizing a property that a block copolymer is self-assembled is discussed (for example, Patent Documents 1 and 2 and Non-Patent Document 1). In the directed self-assembly lithography technique, first, for example, a solution of a block copolymer containing an A polymer chain and a B polymer chain is applied to a substrate, whereby a thin film of the block copolymer is formed. Then, when the substrate is heated, the A polymer chain and the B polymer chain mutually randomly solid-dissolve in the thin film undergo phase separation to form A polymer regions and B polymer regions which are regularly arrayed.

The regular array is realized by a property that the A polymers gathering together and the B polymers gathering together by affinity. However, the A polymer regions and the B polymer regions are not stably arrayed only by depending on the property, failing to obtain a desired pattern in some cases. Hence, a guide pattern that guides the A polymers and the B polymers is utilized to assist or promote array of the A polymers and the B polymers in a desired pattern.

PRIOR ART DOCUMENT

Patent Document

[Patent Document 1] Japanese Patent Application Laid-open No. 2005-29779
[Patent Document 2] Japanese Patent Application Laid-open No. 2007-125699
[Non-Patent Document 1] K. W. Guarini, et al., "Optimization of Diblock Copolymer Thin Film Self Assembly", Advanced Materials, 2002, 14, No. 18, September 16, pp. 1290-1294. (p. 1290, ll.31-51)

DISCLOSURE OF THE INVENTION

Problems to be Solved by the Invention

As a guide pattern, a photoresist pattern is used by the lithography technique in some cases. Here, if there are depressions and projections on side surfaces of the photoresist pattern, the depressions and projections may be reflected in the pattern of the block copolymer. Further, if there are depressions and projections on the side surfaces of the photoresist pattern, for example, a polymer, of the two polymers, which is supposed to be hardly adsorbed to the side surfaces of the photoresist pattern is adsorbed, for example, to projection parts, possibly resulting in inhibiting alternate array of the A polymer regions and the B polymer regions.

Further, in the case of forming holes by the block copolymer, first, a photoresist pattern including the holes is formed as a guide pattern. Then, the block copolymer is filled in the holes and heated, whereby cylinder-shaped portions along inner surfaces of the holes are formed by one of the polymers and pillar-shaped portions filling hollow portions of the cylinder-shaped portions are formed by the other polymer. When the pillar-shaped portions are removed, the holes formed of the one polymer constituting the cylinder-shaped portions are formed (so-called hole shrink). Here, when there are depressions and projections on the inner surfaces of the holes of the photoresist pattern, the block copolymer does not undergo phase separation, resulting in formation of no cylinder-shaped portion and no pillar-shaped portion in some cases.

In consideration of the above circumstances, the present invention provides a pattern forming method, a pattern forming apparatus, and a computer-readable storage medium, each capable of promoting array of different polymers constituting a block copolymer in a desired pattern.

Means for Solving the Problems

According to a first aspect of the present invention, there is provided a pattern forming method including the steps of: forming a photoresist film on a substrate; patterning the photoresist film to form a photoresist pattern; smoothing a surface of the photoresist pattern; applying a block copolymer containing at least two kinds of polymers to the substrate on which the photoresist pattern has been smoothed, to form a film of the block copolymer; heating the substrate on which the film has been formed; irradiating the film with ultraviolet light; and dissolving one of the at least two kinds of polymers.

According to a second aspect of the present invention, there is provided a pattern forming apparatus including: a photoresist film forming unit that supplies a photoresist to a substrate to form a photoresist film on the substrate; a developing unit that develops an exposed photoresist film to form a photoresist pattern; a photoresist treatment unit that smoothes the photoresist pattern; a film forming unit that supplies a block copolymer containing at least two kinds of polymers to the substrate on which the photoresist pattern has been smoothed, to form a film of the block copolymer on the substrate; a heating unit that heats the film; an ultraviolet light irradiation unit that irradiates the film which has been heated by the heating unit with ultraviolet light; and a solvent supply unit that supplies a solvent to the film which has been irradiated with the ultraviolet light, to dissolve one of the at least two kinds of polymers.

Effect of the Invention

According to embodiments of the present invention, there are provided a pattern forming method, a pattern forming apparatus, and a computer-readable storage medium, each capable of promoting array of different polymers constituting a block copolymer in a desired pattern.

BEST MODE FOR CARRYING OUT THE INVENTION

Figure 1:
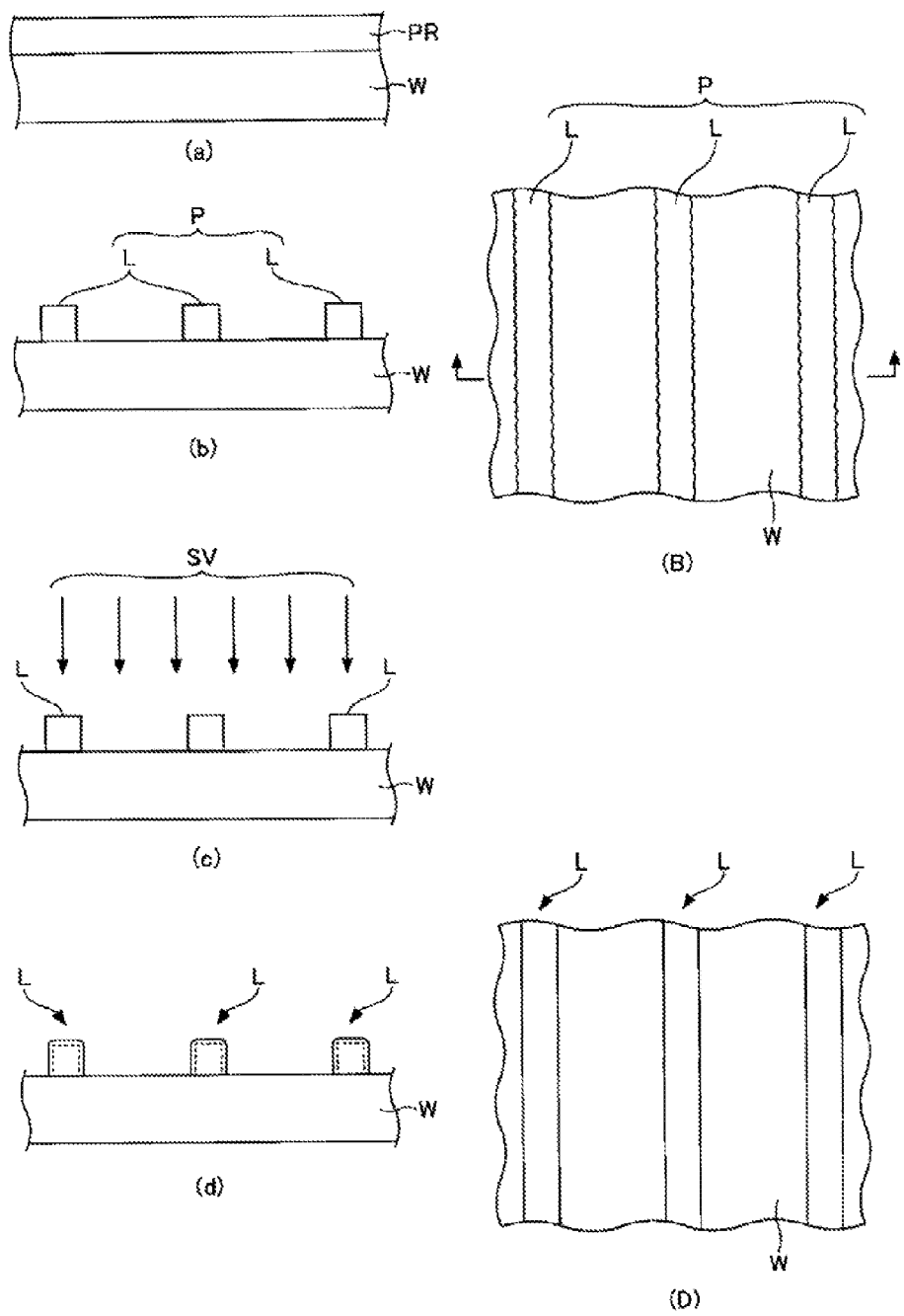
FIG. 1 An explanatory view for explaining a pattern forming method according to a first embodiment of the present invention, (a) illustrating a state of a longitudinal section of a wafer on which a photoresist film has been formed, (b) illustrating a state of a longitudinal section of the wafer on which a photoresist pattern has been formed, (c) illustrating a state that a solvent gas is supplied to the wafer on which the photoresist pattern has been formed, (d) illustrating a longitudinal section of a state that the surface of the resist pattern has swelled, (B) illustrating a top view of the wafer on which the photoresist film has been formed, and (D) illustrating a top view of a state that the surface of the resist pattern has swelled.
Figure 2:
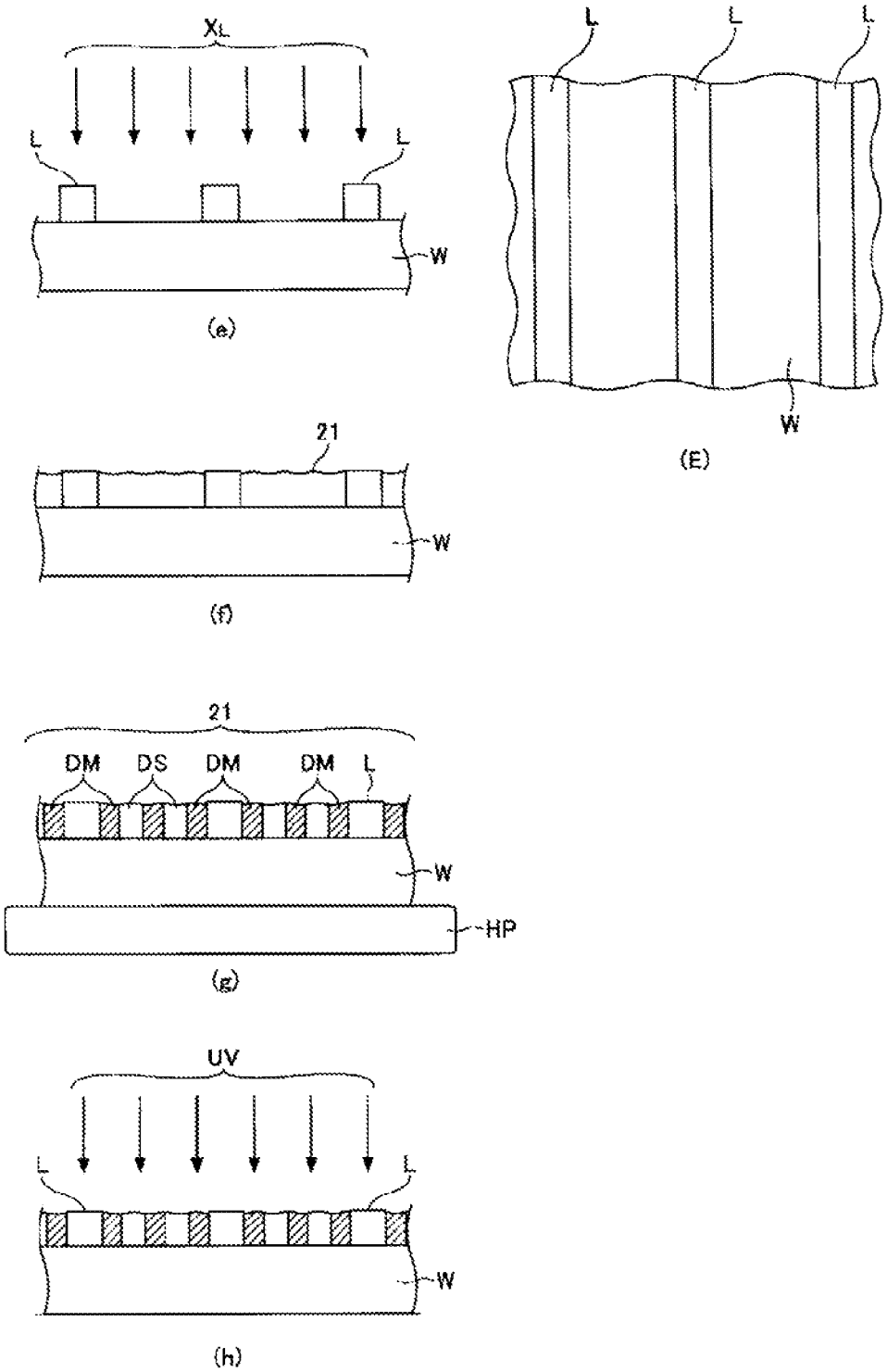
FIG. 2 An explanatory view for explaining the pattern forming method according to the first embodiment of the present invention, subsequent to FIG. 1, (e) illustrating a state that the wafer is irradiated with light, (f) illustrating a state that a film of a block copolymer has been formed on the wafer, (g) illustrating a state that the block copolymer has undergone phase separation, and (h) illustrating an appearance that the wafer is irradiated with ultraviolet light.
Figure 3:
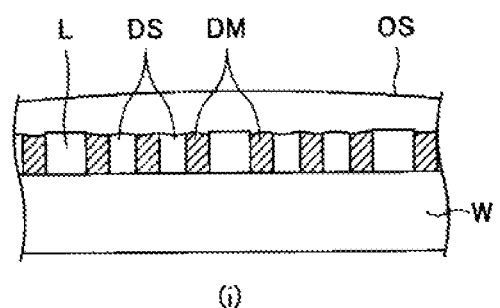
FIG. 3 An explanatory view for explaining the pattern forming method according to the first embodiment of the present invention, subsequent to FIG. 2, (i) illustrating an appearance that an organic solvent is supplied to the block copolymer after phase separation, and (j) illustrating a state that a pattern by polymer regions has been formed on the wafer.
Figure 3:
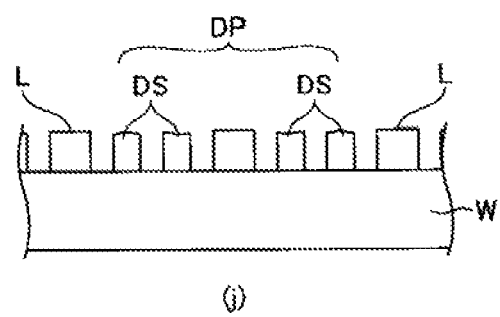

Hereinafter, not-limiting illustrative embodiments of the present invention will be described referring to the accompanying drawings. The same or corresponding reference numerals are given to the same or corresponding members or pars in all the accompanying drawings to omit repeated description.

First Embodiment

Referring to FIG. 1, a pattern forming method according to a first embodiment of the present invention will be described. FIG. 1(a) to FIG. 3(j) are partial cross-sectional views in steps of a substrate (for example, a semiconductor wafer) to be treated by this pattern forming method. Note that FIG. 1(B) is a top view corresponding to FIG. 1(b), and a cross-sectional view taken along a line I-I in FIG. 1(B) corresponds to FIG. 1(b). The same relation also applies to those between FIG. 1(D) and FIG. 1(d) and between FIG. 2(E) and FIG. 2(e).

(Photoresist Pattern Forming Step)

First of all, a photoresist is applied to a semiconductor wafer W (hereinafter, referred to as a wafer W) as illustrated in FIG. 1(a), and a photoresist film PR is formed. Next, when the photoresist film PR is exposed using a photomask (not illustrated) having a predetermined pattern and developed, a photoresist pattern P is obtained as illustrated in FIG. 1(b). The photoresist pattern P has a plurality of lines L extending almost in parallel at predetermined intervals in a predetermined direction in this embodiment. The photoresist pattern P functions as a guide pattern when forming a pattern by a later-described block copolymer (hereinafter, described as BCP in some cases). Note that on the side faces of the lines L, undulations (depressions and projections) occur in some cases as illustrated in FIG. 1(B). One cause of occurrence of the undulations can be interference of exposure light when exposing the photoresist film PR.

Note that for the formation of the photoresist pattern P, ordinary spin coater, heating apparatus, exposure apparatus and developing apparatus can be used.

(Photoresist Pattern Smoothing Step)

Next, a solvent gas SV is supplied to the wafer W on which the photoresist pattern P has been formed, whereby the lines L are exposed to the solvent gas SV (FIG. 1(c)). When the lines L are exposed to the solvent gas, the solvent gas is taken into the surfaces (side surfaces, upper surfaces) of the lines L, so that the surfaces of the lines L dissolve and swell as schematically illustrated in FIG. 1(d). Note that the solvent gas can be obtained by bubbling a solvent retained in a predetermined container using a carrier gas. The solvent is not limited as long as it has solubility to the photoresist pattern P, and may be any of, for example, acetone, propyleneglycol monomethylether acetate (PGMEA), and N-methyl-2-pyrrolidinone (NMP) or a mixed solution of them. Further, as the above-described carrier gas, a rare gas such as helium (He) or argon (Ar), or an inert gas such as a nitrogen gas can be used.

Next, when the wafer W is heated, for example, by irradiation with light $X_L$ as illustrated in FIG. 2(e), the solvent evaporates from the swelled surfaces of the lines L, with the result that the surfaces contract and harden. The side surfaces of the lines L have the above-described undulations, but when the surfaces of the lines L absorb the solvent gas to swell, the undulations are smoothed as illustrated in FIG. 1(D) by the surface tension occurring at the swelled portions. Thereafter, when the wafer W is heated, the swelled portions harden as they are kept smoothed, so that the side surfaces of the lines L are made smoothed as illustrated in FIG. 2(E) as compared with those after formation of the photoresist pattern P.

(DSA Pattern Forming Step)

After the wafer W on which the photoresist pattern P has been formed is cooled to room temperature (for example, about 23° C.), for example, a solution (also called as a coating solution) made by dissolving a polystyrene (PS)-polymethyl methacrylate (PMMA) block copolymer (hereinafter, PS-b-PMMA) in an organic solvent is applied onto the wafer W, for example, by the spin coating method. This forms a film 21 of PS-b-PMMA as illustrated in FIG. 2(f). In this film 21, a PS polymer and a PMMA polymer are randomly mixed together.

Then, the wafer W on which the film 21 of PS-b-PMMA has been formed is heated to a predetermined temperature, for example, by a hot plate HP as illustrated in FIG. 2(g), phase separation occurs in PS-b-PMMA. In this event, the PMMA polymer having hydrophilic property is preferentially adsorbed to the side surfaces of the lines L of the photoresist pattern P, so that PMMA polymer regions DM composed of the PMMA polymer and PS polymer regions DS composed of the PS polymer are alternately arrayed in this order. Note that the space between the lines L has been preliminarily decided to be equal to a sum of an integral multiple of the total of the width of the PMMA polymer region DM and the width of the PS polymer region DS, twice in the illustrated example, and the width of the PMMA polymer region DM.

After finish of the heating, the film 21 of PS-b-PMMA on the wafer W is irradiated with ultraviolet light UV, for example, under an atmosphere of a rare gas such as argon (Ar) or helium (He) or an inert gas such as a nitrogen gas as schematically illustrated in FIG. 2(h). The ultraviolet light UV is not particularly limited as long as it has a wavelength component belonging to an ultraviolet light region, but preferably has a wavelength component of, for example, 200 nm or less. Further, the ultraviolet light further preferably contains a wavelength component of 185 nm or less that can be absorbed by PMMA. In the case of using the ultraviolet light having a wavelength component with a wavelength of 200 nm or less, an Xe excimer lamp emitting ultraviolet light with a wavelength of 172 nm can be preferably used as a light source LS.

It is considered that when the film 21 of PS-b-PMMA is irradiated with the ultraviolet light, the PS polymer becomes difficult to dissolve in the organic solvent because cross-linking reaction occurs in the PS polymer, whereas the PMMA polymer becomes easy to dissolve in the organic solvent because the main chain is cut in the PMMA polymer.

Next, as illustrated in FIG. 3(i), an organic solvent OS is supplied to the film 21 of PS-b-PMMA. Due to the organic solvent OS, the PMMA polymer regions DM in the film 21 dissolve and the PS polymer regions DS remain on the surface of the wafer W. In other words, the PMMA polymer is selectively removed. Here, as the organic solvent OS, for example, isopropyl alcohol (IPA) can be preferably used.

When the surface of the wafer W is dried after a lapse of a predetermined time, a pattern DP composed of the PS polymer regions DS is obtained on the wafer W as illustrated in FIG. 3(j).

As described above, according to the pattern forming method according to this embodiment, the photoresist pattern P serving as the guide pattern for the pattern DP by PS-b-PMMA is exposed to the solvent gas SV and thereby swells to smooth the undulations (depressions and projections) on the side surfaces of the photoresist pattern P. If the photoresist pattern P has the undulations on the side surfaces of the lines L, the PS polymer that is unlikely to be adsorbed to the side surfaces of the lines L will be adsorbed, for example, to their projecting portions and may hinder the PMMA polymer regions DM from being adsorbed to the side surfaces of the lines L. This case may cause a situation that the alternate array of the PMMA polymer regions DM and the PS polymer regions DS is hindered. However, by the pattern forming method according to this embodiment, the side surfaces of the photoresist pattern P as the guide pattern are smoothed, so that the PMMA polymer having hydrophilic property with the photoresist pattern P is further preferentially adsorbed to the side surfaces of the photoresist pattern P, thereby ensuring that the PMMA polymer regions DM and the PS polymer regions DS are more surely alternately arrayed.

Second Embodiment

Next, a pattern forming method according to a second embodiment of the present invention will be described.

(Photoresist Pattern Forming Step)

Figure 4:
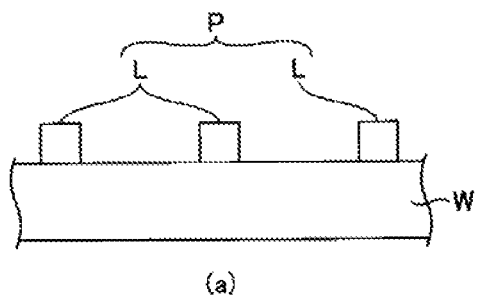
FIG. 4 An explanatory view for explaining a pattern forming method according to a second embodiment of the present invention, (a) illustrating a state of a longitudinal section of a wafer on which a photoresist pattern has been formed, (b) illustrating a state that an acid solution is supplied to the wafer on which the photoresist pattern has been formed, (c) illustrating a state that an alkaline solvent is supplied to the wafer on which the photoresist pattern has been formed, and (d) illustrating a state that a pattern by polymer regions has been formed on the wafer.
Figure 4:
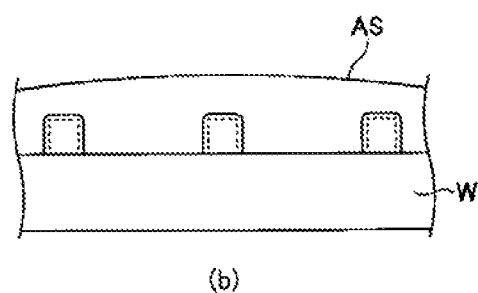
Figure 4:
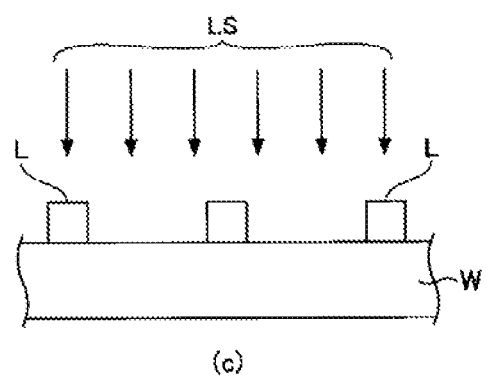
Figure 4:
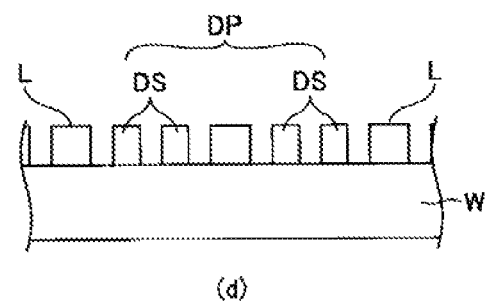

In the pattern forming method according to this embodiment, first, the photoresist pattern forming step in the pattern forming method according to the first embodiment is performed to form a photoresist pattern P having lines L on a wafer W as illustrated in FIG. 4(a). As described above, the side surfaces of the lines L have the undulations as described above.

(Photoresist Pattern Slimming Step)

As illustrated in FIG. 4(b), an acid solution AS is supplied to the wafer W on which the photoresist pattern P has been formed. An example of the acid solution AS is a solution for forming an anti-reflection film. The lines L of the photoresist pattern P are exposed to the acid solution AS for a predetermined time so that the acid solution AS diffuses into the lines L. Then, the acid solution AS on the wafer W is removed and then the wafer W is heated at a temperature in a range of, for example, about 50° C. to about 120° C., whereby a soluble layer is formed on the surfaces of the lines L. Note that the heating here of the wafer W may be performed, for example, using a heating apparatus such as a hot plate, or may be performed by light irradiation.

Then, as illustrated in FIG. 4(c), for example, an alkaline solvent LS or gas containing vapor of the alkaline solvent LS is sprayed to the photoresist pattern P on the wafer W to remove the soluble layer. Thus, the lines L become thinner correspondingly to the soluble layer. Note that at the time when the acid solution AS diffuses on the surfaces of the lines L and the soluble layer is formed, the acid solution AS can diffuse without reflecting the undulations of the side surfaces of the lines L, so that the undulations are reduced at the exposed surfaces of the lines L from which the soluble layer has been removed. In other words, not only the lines L become thinner but also the side surfaces of the lines L are smoothed by the slimming.

(DSA Pattern Forming Step)

Then, when the same step as the DSA pattern forming step in the pattern forming method according to the first embodiment is performed, the pattern DP composed of the PS polymer regions DS is formed on the wafer W as illustrated in FIG. 4(d).

By the pattern forming method according to this embodiment, the lines L are slimmed by forming the soluble layer on the surfaces of the lines L using the acid solution and removing the soluble layer by spray of the alkaline solvent. The slimming smoothes the side surfaces of the lines L and thereby achieves the same effects as those described in the first embodiment.

Note that, in the second embodiment, the space between the lines L after the slimming is preliminarily decided to be equal to a sum of an integral multiple of the total of the width of the PMMA polymer region DM and the width of the PS polymer region DS, twice in the illustrated example, and the width of the PMMA polymer region DM.

Further, since the thickness of the soluble layer can be adjusted depending on the conditions such as the time of exposing the lines L to the acid solution, the degree of acidity of the acid solution and so on, it is preferable to decide beforehand the conditions by carrying out a preparatory experiment or the like.

Further, the slimming of the lines L of the photoresist pattern P can be performed, for example, even by supplying a solvent gas to the lines L in the first embodiment to swell the surfaces of the lines L and then supplying an organic solvent onto the wafer W to dissolve the swelled portions. As the organic solvent, a stripping solution or the like can be used. The stripping solution or the like only needs to be liquid having solubility with respect to the resist to be used, and concretely, may be a choline aqueous solution (trimethyl-2-hydroxyethyl ammonium hydroxide solution) or a KOH solution. Further, in place of the stripping solution, a developing solution may be used.

Third Embodiment

Next, a pattern forming method according to a third embodiment of the present invention will be described.

(Photoresist Pattern Forming Step and Photoresist Pattern Smoothing Step)

Figure 5:
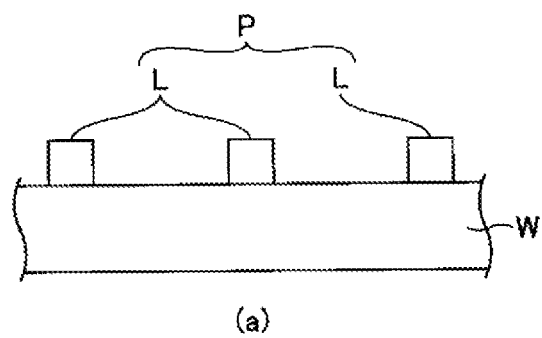
FIG. 5 An explanatory view for explaining a pattern forming method according to a third embodiment of the present invention, (a) illustrating a state of a longitudinal section of a wafer on which a photoresist film has been formed, (b) illustrating an appearance that the wafer is irradiated with ultraviolet light, and (c) illustrating a state that a pattern by polymer regions has been formed on the wafer.
Figure 5:
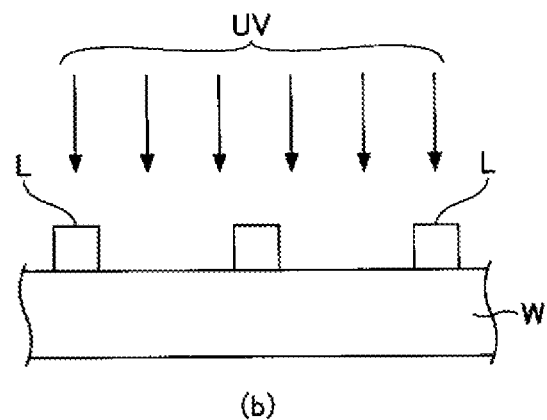
Figure 5:
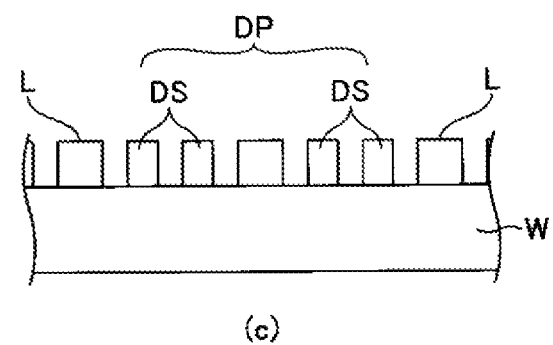

First, the photoresist pattern forming step and the photoresist pattern smoothing step in the first embodiment are performed to form a photoresist pattern P having lines L on a wafer W as illustrated in FIG. 5(a). Here, the side surfaces of the lines L have been smoothed by the photoresist pattern smoothing step.

(Photoresist Pattern Hydrophilizing Treatment Step)

Next, the wafer W on which the photoresist pattern P has been formed is irradiated with ultraviolet light under an air atmosphere (FIG. 5(b)). Thus, atmospheric oxygen is activated by the ultraviolet light to generate active oxygen, and the active oxygen hydrophilizes the surfaces of the lines L of the photoresist pattern P.

(DSA Pattern Forming Step)

Thereafter, when the DSA pattern forming step in the pattern forming method according to the first embodiment is performed, the pattern DP composed of the PS polymer regions DS is formed on the wafer W as illustrated in FIG. 5(c).

The surfaces (side surfaces) of the lines L of the photoresist pattern P originally have hydrophilic property, but there even is a case where a polymer that is likely to be adsorbed to a hydrophobic surface, namely, a polymer that has high affinity to hydrophobic property is adsorbed thereto. However, by the pattern forming method according to this embodiment, the surfaces of the lines L can be surely hydrophilized with the active oxygen generated by the ultraviolet light. Therefore, at the time when heating the film 21 of PS-b-PMMA in the DSA pattern forming step, the PMMA polymer in the film 21 is preferentially adsorbed to the side surfaces of the lines L. In other words, the PMMA polymer regions are formed in contact with the side surfaces of the lines L and the PS polymer regions are formed adjacent to them. Accordingly, the PMMA polymer regions and the PS polymer regions are more surely alternately arrayed.

Note that hydrophilizing the photoresist pattern P can be performed also by exposing the photoresist pattern P to a solution of a silane coupling agent (or gas containing vapor of the silane coupling agent), instead of the ultraviolet light irradiation under the air atmosphere. Examples of usable silane coupling agent include 1-propanol, 2-butanol, isobutanol, tert-pentanol, β-methallyl alcohol, 3-methyl-3-pentanol, 1,2-dimethyl-2-propene-1-ol.

Further, hydrophilizing the photoresist pattern P may be performed by depositing a silicon oxide film on the surfaces of the lines L or applying a PMMA polymer on the surfaces of the lines L. Note that even if the silicon oxide film is deposited on the upper surfaces of the lines L, the upper surface of a base layer of the lines L, namely, the upper surface of the wafer W in this embodiment, the PMMA polymer regions will come into contact with the side surfaces of the lines L, so that the PMMA polymer regions and the PS polymer regions are more surely alternately arrayed. However, it is preferable to remove the silicon oxide film on the upper surfaces of the lines L and the upper surface of the base layer of the lines L, for example, by dry etching using a CF-based gas plasma to leave the silicon oxide film on the side surfaces of the lines L. Note that the base layer in this embodiment is the wafer W.

Figure 6:
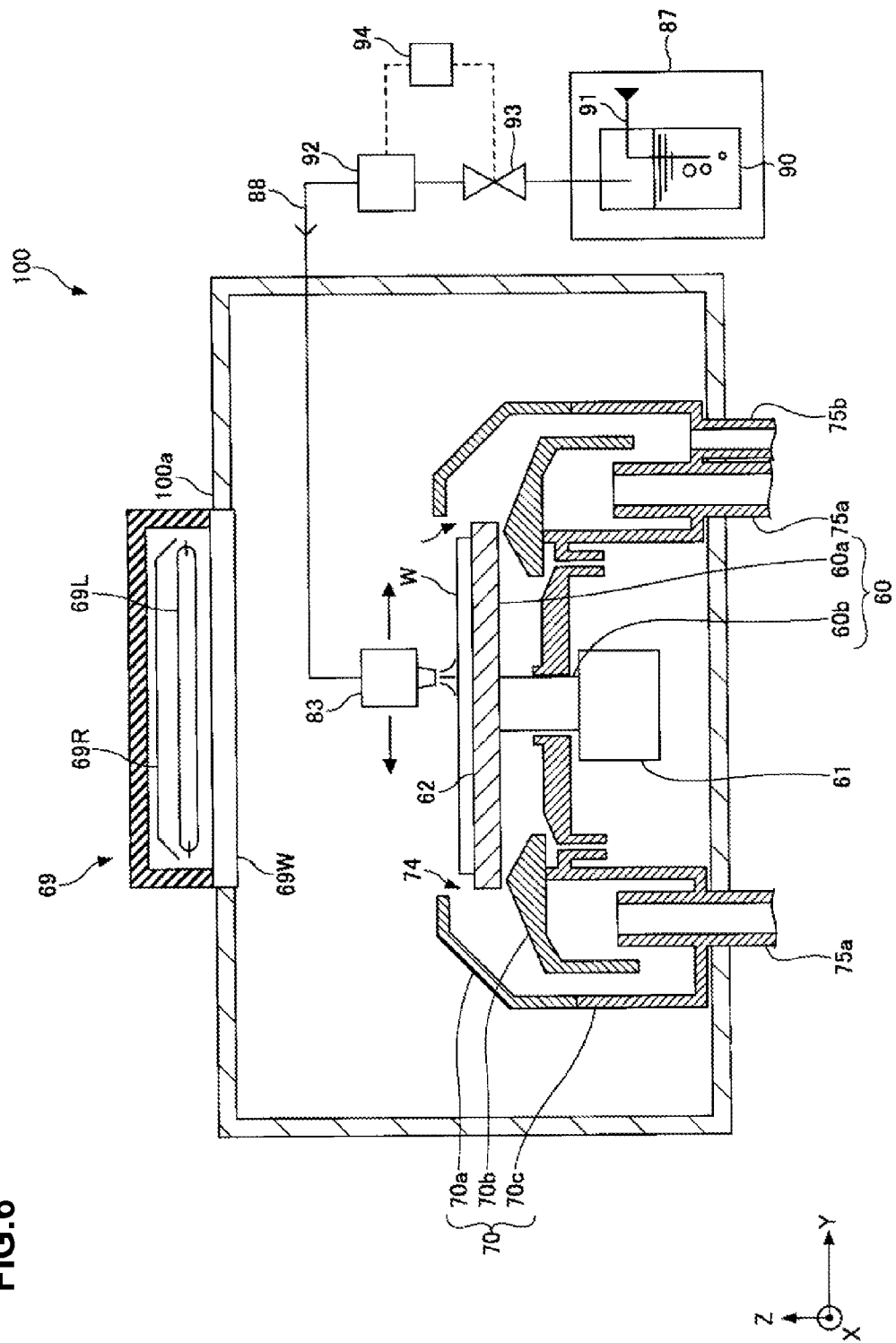
FIG. 6 A schematic side view illustrating a photoresist treatment apparatus preferably usable when performing the pattern forming methods according to the embodiments of the present invention.
Figure 7:
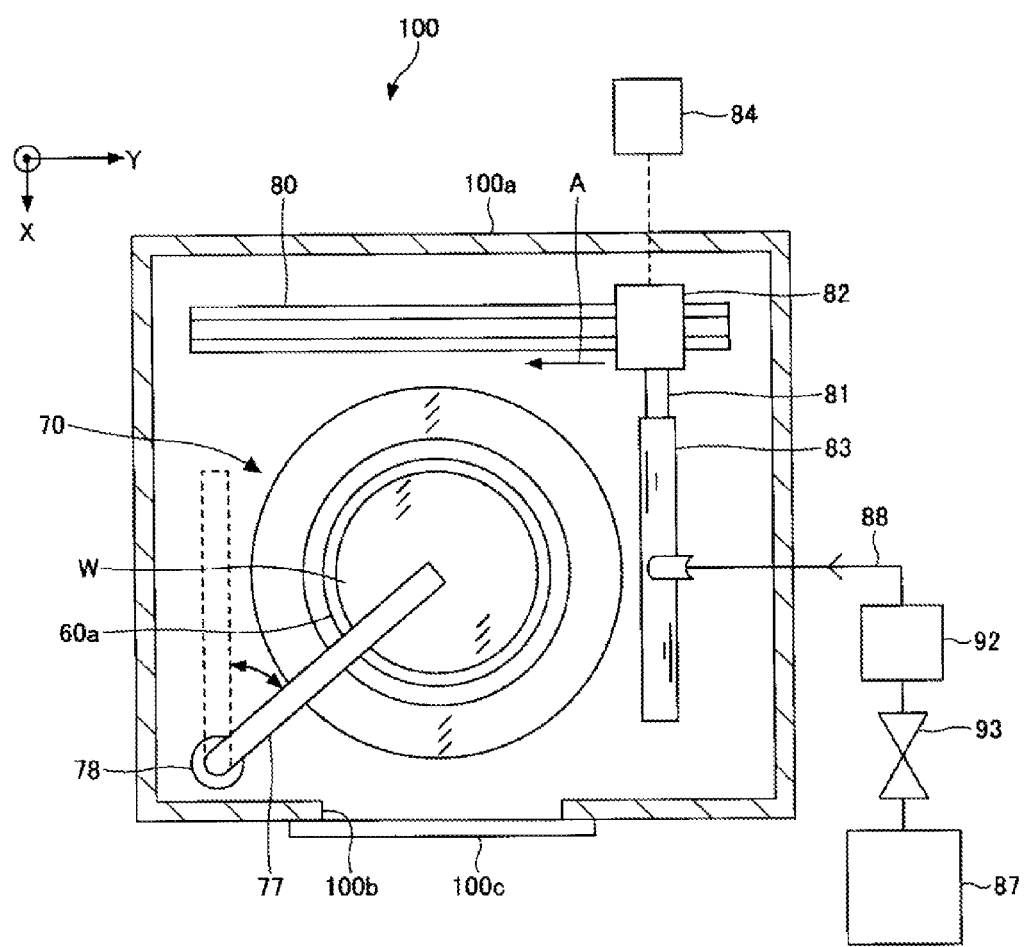
FIG. 7 A schematic top view illustrating the photoresist treatment apparatus illustrated in FIG. 6.
Figure 8:
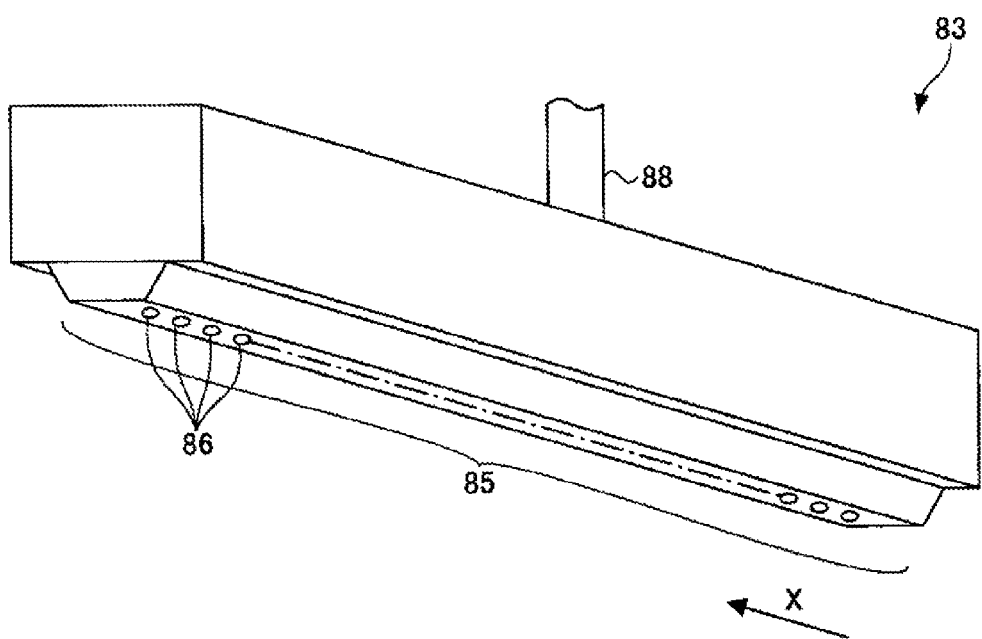
FIG. 8 A perspective view illustrating a solvent supply nozzle in the photoresist treatment apparatus illustrated in FIG. 6.

Next, a photoresist treatment apparatus suitable for performing the photoresist pattern smoothing step in the first embodiment will be described referring to FIG. 6 to FIG. 8. As illustrated in FIG. 6 and FIG. 7, a photoresist treatment apparatus 100 has a cup 70 provided at substantially a central portion inside a housing 100a, a chuck 60 disposed in the cup 70, a dispenser 77 that supplies the stripping solution or the like to the surface of the wafer W held on the chuck 60, and a solvent supply nozzle 83 that supplies the solvent gas to the photoresist film on the wafer W. Further, referring to FIG. 7, the housing 100a is provided with a transfer port 100b that allows passage of the wafer W by an external transfer apparatus (not illustrated) and a shutter 100c that opens and closes the transfer port 100b, for transfer-in/out of the wafer W.

The cup 70 has an outer cup 70a, an inner cup 70b, and a base 70c as illustrated in FIG. 6. The outer cup 70a receives the stripping solution or the like that is supplied onto the wafer W and scatters due to the rotation of the wafer W and its mist, and discharges them to the outside of the photoresist treatment apparatus 100. The inner cup 70b receives the stripping solution or the like bouncing off the outer cup 70a and the striping solution or the like flowing down from the wafer W.

The outer cup 70a and the inner cup 70b are substantially concentrically arranged by the base 70c. At the bottom portion of the base 70c, a drain port 75a and an exhaust port 75b are provided. The drain port 75a is connected to a drain pipe (not illustrated) that drains the stripping solution or the like, and drains the stripping solution or the like flowing down from the outer cup 70a and the inner cup 70b to the outside. The exhaust port 75b end is connected to an exhaust system (not illustrated), whereby the cup 70 is exhausted.

Inside the cup 70, the chuck 60 is provided which holds and rotates the wafer W thereon. The chuck 60 has a wafer holding part 60a that holds the wafer W, and a support post 60b that supports the wafer holding part 60a. The wafer holding part 60a is supported by the support post 60b to be substantially horizontal, and has a flat upper surface and a diameter substantially the same as the diameter of wafer W. The wafer holding part 60a is provided with a plurality of suction ports (not illustrated) opening to the upper surface, and sucking the wafer W through the suction ports holds the wafer W on the upper surface of the wafer holding part 60a. Further, the support post 60b of the chuck 60 is coupled to a drive part 61. By means of the drive part 61, the chuck 60 can rotate and is vertically movable. The vertical movement of the chuck 60, the wafer W is delivered to/from the transfer apparatus (not illustrated).

Referring to FIG. 6, at a position above the cup 70 at the ceiling portion of the housing 100a, a lamp 69L that heats the wafer W held on the chuck 60, a lamp house 69 that houses the lamp 69L and has a transmission window 69W at its lower surface, and a reflection plate 69R that is arranged above the lamp 69L in the lamp house 69 are provided. As the lamp 69L, for example, a xenon flash lamp can be used. Further, the transmission window 69W is preferably made of, for example, quartz glass that transmits light emitted from the xenon flash lamp.

The xenon flash lamp has a glass tube in which a xenon gas is enclosed and which is provided with electrodes at both ends, a discharge capacitor that is connected in parallel with both electrodes, a trigger circuit that is provided in parallel with the glass tube and the discharge capacitor, and a trigger electrode that is connected to the trigger circuit via a transformer and provided close to an outer peripheral surface of the glass tube (any of them is not illustrated). When the discharge capacitor becomes charged and a voltage raised to several tens of volts by the transformer is applied to the trigger electrode, dielectric breakdown occurs in the glass tube and static energy is released from the discharge capacitor, and current instantaneously flows between both electrodes. Joule heat in this event heats the xenon gas to release light. The static energy from the discharge capacitor is released in several tens of milliseconds, so that light is released in an extremely short time and heats the wafer W.

Referring to FIG. 7, a rail 80 that extends along the Y-direction is provided on a −X-direction side of the cup 70 in the photoresist treatment apparatus 100. One end of the rail 80 is located at a −Y-direction side of the cup 70, and the other end is located at a +Y-direction side of the cup 70. On the rail 80, a drive part 82 including, for example, a linear motor is disposed to reciprocate, and an arm 81 is attached to the drive part 82. At the tip of the arm 81, a solvent supply nozzle 83 is attached as a nozzle that discharges a solvent gas to the wafer W. With such a configuration, the solvent supply nozzle 83 is driven by the drive part 82 and is movable to pass over the chuck 60. Further, the movement of the solvent supply nozzle 83 is controlled by a drive control unit 84 that controls the operation of the drive part 82 and can move the solvent supply nozzle 83 in the Y-direction at a predetermined speed by means of the drive control unit 84.

The solvent supply nozzle 83 has an elongated shape extending in the X-direction, and one end (an attachment portion with the arm 81) of solvent supply nozzle 83 is located at the −X-direction side of the wafer holding part 60a of the chuck 60 and the other end thereof is located at the +X-direction side of the wafer holding part 60a. Further, as illustrated in FIG. 8, a lower surface of the solvent supply nozzle 83 is formed with a discharge part 85 from one end to the other end in the longitudinal direction. The discharge part 85 is formed with a plurality of discharge ports 86 opening to the lower surface of the discharge part 85 along the longitudinal direction of the solvent supply nozzle 83. The discharge ports 86 communicate with a conduit (not illustrated) inside the solvent supply nozzle 83, and the conduit communicates with a solvent supply pipe 88 connected to the upper portion of the solvent supply nozzle 83 as illustrated in FIG. 6. The solvent supply pipe 88 is connected to a solvent gas supply source 87 as illustrated in FIG. 6. With such a configuration, the solvent supply nozzle 83 can introduce a solvent gas from the solvent gas supply source 87 thereinto through the solvent supply pipe 88, and uniformly discharge the introduced solvent gas downward from the discharge ports 86 in the lower surface.

As illustrated in FIG. 6, the solvent gas supply source 87 includes, for example, a retention tank 90 that is connected to the solvent supply pipe 88 and retains liquid solvent, and a carrier gas supply pipe 91 that supplies a carrier gas into the retention tank 90. By supplying the carrier gas from the carrier gas supply pipe 91 into the liquid solvent in the retention tank 90 and bubbling the carrier gas, the carrier gas (hereinafter, referred to as a solvent gas) containing vapor of the solvent can be pressure-fed into the solvent supply pipe 88. Thus, the solvent gas is supplied to the solvent supply nozzle 83 through the solvent supply pipe 88.

The solvent supply pipe 88 is further provided with a flow rate sensor 92 that detects the flow rate of the solvent gas and a valve 93 that regulates the flow rate. The detection result detected by the flow rate sensor 92 is outputted to a flow rate control unit 94, and the flow rate control unit 94 can regulate the flow rate of the solvent gas to be supplied to the solvent supply nozzle 83 by regulating the open and close degree of the valve 93 on the basis of the detection result.

The dispenser 77 supplies the stripping solution or the like (second solvent) to the patterned photoresist film on the wafer W. The dispenser 77 is capable of turning by means of a drive part (not illustrated) and can be disposed at a waiting position indicated by a dotted line and a supply position indicated by a solid line in FIG. 7. Further, the dispenser 77 and the drive part have two inner conduits (not illustrated) from the lower end of the drive part to the tip of the dispenser 77, and can discharge the stripping solution or the like through one of the inner conduits and discharge pure water or deionized water for cleaning through the other inner conduit. With such a configuration, the dispenser 77 can selectively supply the stripping solution or the like and the pure water or the like to the wafer W.

In the photoresist treatment apparatus 100 having the above configuration, the photoresist pattern smoothing step in the first embodiment can be performed in the following procedure. First, the wafer W formed with the photoresist pattern P as illustrated in FIG. 1(b) is transferred into the housing 100a through the transfer port 100b and held on the chuck 60. Then, the solvent supply nozzle 83 starts to move in the −Y-direction as illustrated by an arrow A in FIG. 7. When the solvent supply nozzle 83 reaches a position above one end of the wafer holding part 60a from the outside of the cup 70, for example, exhaust from the cup 70 is temporarily stopped, and the solvent gas starts to be discharged at a constant flow rate from the solvent supply nozzle 83. Thereafter, the solvent supply nozzle 83 moves to the other end side (−Y-direction) of the wafer W at a constant speed while discharging the solvent gas, whereby the photoresist pattern P on the wafer W is exposed to the solvent gas. Then, when the solvent supply nozzle 83 is moved to a position above an end on the −Y-direction of the wafer holding part 60a, the solvent supply nozzle 83 turns back and moves from the other end to the one end of the wafer W (in the +Y-direction). In this manner, the solvent supply nozzle 83 reciprocates above the wafer W and supplies the solvent gas to the surface of the photoresist pattern P on the wafer W as illustrated in FIG. 1(c). After finish of the reciprocation of the solvent supply nozzle 83, the supply of the solvent gas is stopped and the exhaust from the cup is resumed.

When the wafer W is irradiated with light by the lamp 69L after the solvent supply nozzle 83 retracts to the outside of the cup 70, the wafer W and the photoresist pattern P are heated. By the above procedure, the surfaces of the photoresist pattern P (lines L) are exposed to the solvent gas to swell, and harden because the solvent gas evaporates from the swelled surfaces due to the heating by the lamp 69L. Since the surfaces harden after swelling, the side surfaces of the lines L of the photoresist pattern P can be smoothed. Namely, according to the photoresist treatment apparatus 100, the same effects as those achieved by the pattern forming method in the first embodiment can be achieved.

Note that it is also possible to slim the lines L by supplying the stripping solution or the like onto the wafer W from the dispenser 77 after exposing the photoresist pattern P to the solvent gas to dissolve the swelled portion of the surfaces of the lines L of the photoresist pattern P.

Further, it is also possible to modify the photoresist treatment apparatus 100 so that the dispenser 77 can discharge the acid solution and the solvent supply nozzle 83 can spray gas containing the alkaline solvent. This makes it possible to discharge the acid solution to the wafer W held on the chuck 60, heat the wafer W by the lamp 69, and spray the gas containing the alkaline solvent to the wafer W. Namely, in the photoresist treatment apparatus 100, the photoresist pattern slimming step in the second embodiment can be performed.

Next, a block copolymer (BCP) film forming apparatus, a BCP film treatment apparatus, and an ultraviolet light irradiation apparatus suitable for performing the DSA pattern forming step in the first to third embodiments will be described referring to FIG. 9 and FIG. 10.

(BCP Film Forming Apparatus)

Figure 9:
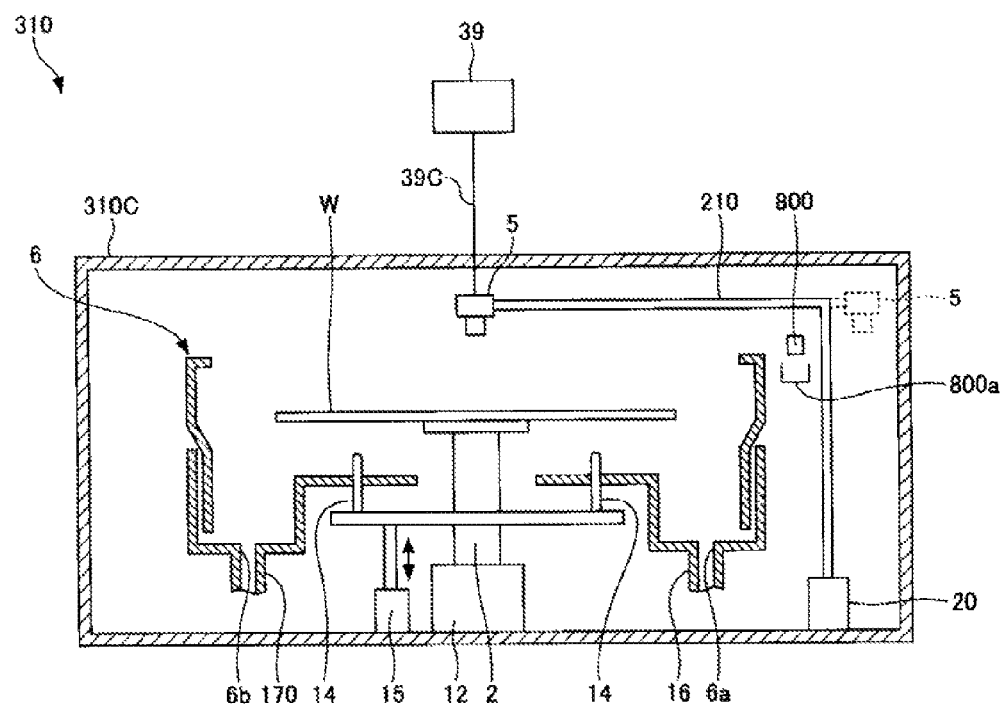
FIG. 9 A schematic side view illustrating a solution treatment apparatus preferably usable when performing the pattern forming method according to the embodiments of the present invention.

Referring to FIG. 9, a BCP film forming apparatus 310 has a housing 310C and has, in the housing 310C, a spin chuck 2 that rotatably holds the wafer W, a supply nozzle 5 that is movable along the surface of the wafer W held on the spin chuck 2 and supplies (discharges) the coating solution of the block copolymer to the wafer W, and a cup 6 that surrounds the outer periphery of the wafer W held on the spin chuck 2 and receives the coating solution that is supplied from the supply nozzle 5 to the surface of the wafer W and scatters due to the rotation of the wafer W. Note that one side wall of the housing 310C is formed with a transfer-in and transfer-out port (not illustrated) for the wafer W, and the transfer-in and transfer-out port can be opened and closed by a shutter (not illustrated).

The cup 6 is formed in a cylindrical shape, for example, with the lower surface closed and the upper surface opened. At a bottom portion of the cup 6, an exhaust port 6a and a drain port 6b are provided. To the exhaust port 6a, an exhaust pipe 16 is connected which is connected to an exhaust apparatus (not illustrated) such as an exhaust pump or the like. Further, to the drain port 6b, a drain pipe 170 is connected which is connected to, for example, a drain section (not illustrated) of a factory so that the coating solution recovered by the cup 6 is drained to the outside of the BCP film forming apparatus 310.

To the spin chuck 2, for example, a servo motor 12 is coupled, and the spin chuck 2 and the wafer W held on the spin chuck 2 are rotated at a predetermined rotation speed by the servo motor 12.

Further, in a manner to surround the spin chuck 2, for example, three support pins 14 are provided which support and raise and lower the wafer W. Note that two support pins 14 are illustrated in FIG. 9. The support pins 14 can rise and lower through through holes (not illustrated) formed in the bottom portion of the cup 6 by means of a raising and lowering drive mechanism 15 such as a cylinder. The support pins 14 can project to a position higher than the upper surface of the spin chuck 2 by the raising and lowering drive mechanism 15 and deliver the wafer W to/from the spin chuck 2.

The supply nozzle 5 is supported by a pivoting and raising and lowering arm 210 coupled to a moving mechanism 20 that is arranged outside the cup 6 and has a horizontally pivoting and raising and lowering function as illustrated in FIG. 9. By means of the moving mechanism 20, the supply nozzle 5 is movable between a position outside the cup 6 (position indicated by a dotted line) and a position above the center of the wafer W (position indicated by a solid line). Further, the supply nozzle 5 is connected to a supply source 39 that retains, for example, the solution (coating solution) of PS-b-PMMA via a supply pipe 39L, and can supply the coating solution from the supply source 39 to the wafer W.

According to the BCP film forming apparatus 310 configured as described above, the coating solution is supplied from the supply nozzle 5 to the wafer W held on the spin chuck 2, and the wafer W is rotated at a predetermined number of rotations, whereby a film of PS-b-PMMA is formed on the wafer W. The film is subjected to heat treatment and irradiation with ultraviolet light in a later-described ultraviolet light irradiation apparatus.

(BCP Film Treatment Apparatus)

To the film of PS-b-PMMA subjected to the heat treatment and the irradiation with ultraviolet light, an organic solvent is supplied to dissolve the PMMA polymer regions. For dissolving the PMMA polymer regions, a BCP film treatment apparatus can be used. The BCP film treatment apparatus has substantially the same configuration as that of the BCP film forming apparatus 310 except that the supply source 39 in the BCP film forming apparatus 310 retains, for example, an organic solvent such as IPA and can supply the organic solvent from the supply nozzle 5 to the wafer W. Therefore, repeated description will be omitted.

Note that in the BCP film treatment apparatus, outside the cup 6, a rinse solution discharge nozzle 800 may be provided which supplies a rinse solution toward the wafer W held on the spin chuck 2 as illustrated in FIG. 9. Further, the rinse solution discharge nozzle 800 can move between a position above the center of the wafer W and a waiting section 800a by means of a moving mechanism and a pivoting and raising and lowering arm (not illustrated) similarly to the supply nozzle 5. Further, the rinse solution discharge nozzle 800 is connected to a rinse solution supply source (not illustrated) via a rinse solution supply pipe (not illustrated). Such a configuration makes it possible to rinse away the organic solvent remaining on the wafer W with the rinse solution supplied from the rinse solution supply source.

(Ultraviolet Light Irradiation Apparatus)

Next, the ultraviolet light irradiation apparatus 400 will be described referring to FIG. 10. As illustrated in FIG. 10, the ultraviolet light irradiation apparatus 400 has a wafer chamber 510 that houses the wafer W, and a light source chamber 520 that irradiates the wafer W housed in the wafer chamber 510 with the ultraviolet light.

The wafer chamber 510 includes a housing 53, a transmission window 54 that is provided at a ceiling portion of the housing 53 and can transmit the ultraviolet light, and a susceptor 57 above which the wafer W is placed. The transmission window 54 is formed of, for example, quartz glass.

The susceptor 57 has a disk shape and has a heater 62 therein. The heater 62 is connected to a temperature regulator 63, whereby the susceptor 57 is kept at a predetermined temperature. Further, on an upper surface of the susceptor 57, a plurality of (for example, three) support pins 58 that support the wafer W are provided. The susceptor 57 has a diameter equal to or slightly larger than that of the wafer W, and is preferably formed of, for example, silicon carbide (SiC) or aluminum having a high heat conductivity.

The plurality of support pins 58 have a function of inhibiting the wafer W from being excessively heated, and promoting cooling of the wafer W after heating. Therefore, the support pins 58 are preferably formed of a material having a high heat conductivity of, for example, 100 W/(m·k) or more, for example, silicon carbide (SiC). Note that to promote heat conduction from the wafer W to the susceptor 57, not only three support pins 58, but also much more support pins 58 may be provided.

Figure 10:
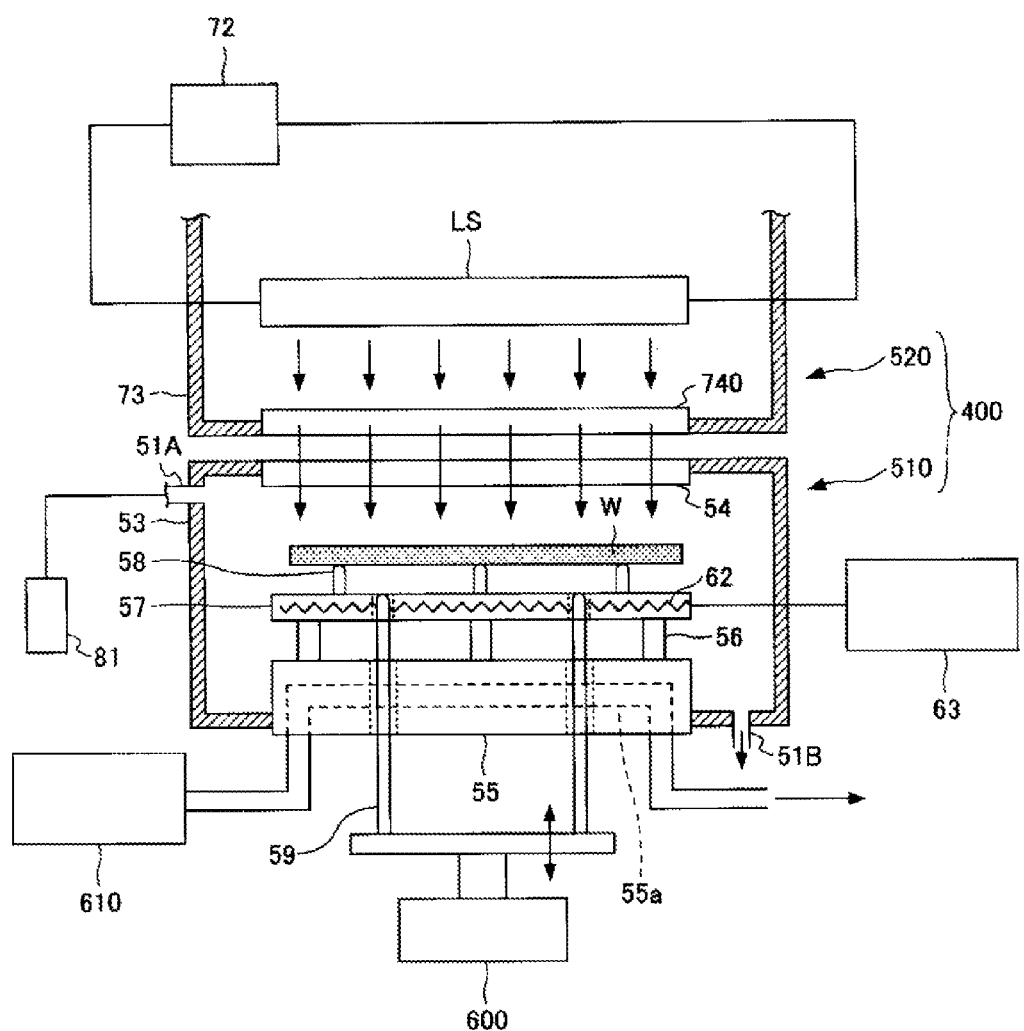
FIG. 10 A schematic side view illustrating an ultraviolet light irradiation apparatus preferably usable when performing the pattern forming methods according to the embodiments of the present invention.

Further, as illustrated in FIG. 10, inside a base plate 55, a water flow passage 55a for a cooling water is formed. To the water flow passage 55a, the cooling water is supplied from a cooling water supply apparatus 610 to cool the whole base plate 55 to a predetermined temperature. Further, support posts 56 that are provided on the base plate 55 and support the susceptor 57 are preferably formed of, for example, aluminum.

Further, in the wafer chamber 510, raising and lowering pins 59 that support the wafer W from below and raise and lower the wafer W when the wafer W is transferred in/out by passing through the base plate 55 and the susceptor 57 and performing a rising and lowering operation, and a raising and lowering mechanism 600 that raises and lowers the raising and lowering pins 59, are provided. Further, one side wall of the housing 53 is formed with a transfer-in/out port (not illustrated) for the wafer W through which the wafer W is transferred into the wafer chamber 510 and transferred out of the wafer chamber 510. A shutter (not illustrated) is provided at the transfer-in/out port, and the transfer-in/out port is opened and closed by the shutter. It is preferable that the shutter can hermetically close the transfer-in/out port.

Further, an inert gas introduction port 51A is provided in a side wall of the housing 53, and an inert gas exhaust port 51B is provided at a bottom portion of the housing 53. To the inert gas introduction port 51A, an inert gas supply source 81 that retains (is filled with) the inert gas is connected, and the inert gas is supplied from the inert gas supply source 81 to the inside of the wafer chamber 510 through the inert gas introduction port 51A.

On the other hand, the light source chamber 520 placed above the wafer chamber 510 includes a light source LS that irradiates the wafer W in the wafer chamber 510 with the ultraviolet light, and a power source 72 that supplies power to the light source LS. The light source LS is housed in a housing 73. An irradiation window 740 formed of, for example, quartz glass is provided in a bottom portion of the housing 73 so as to transmit the ultraviolet light emitted from the light source LS, to the wafer chamber 510. The ultraviolet light from the light source LS is emitted toward the wafer chamber 510 through the irradiation window 740, and the ultraviolet light transmitted through the transmission window 54 of the wafer chamber 510 is applied to the wafer W.

In the ultraviolet light irradiation apparatus 400 configured as described above, the film of PS-b-PMMA formed on the wafer W in the BCP film forming apparatus 310 is heated and exposed as follows. Namely, the wafer W on which the film of PS-b-PMMA has been formed is transferred into the wafer chamber 510, received by the raising and lowering pins 59, and supported on the support pins 58 on the susceptor 57. The shutter is closed to isolate the inside of the wafer chamber 510 from the external environment. Then, the inert gas supply source 81 supplies the inert gas such as a nitrogen gas into the wafer chamber 510 for a predetermined time to thereby purge the air remaining in the wafer chamber 510. This brings the inside of the wafer chamber 510 to an inert gas atmosphere.

While purging the inside of the wafer chamber 510 with the inert gas, the wafer W supported on the support pins 58 is heated to a predetermined temperature by the heater 62 in the susceptor 57. After a lapse of a predetermined time, when the supply of the power to the heater 62 is stopped, the heat of the wafer W is transmitted to the base plate 55 via the support pins 58 and the susceptor 57, whereby the wafer W is cooled down, for example, to approximately room temperature (about 23° C.).

After the wafer W reaches approximately room temperature, the power is supplied from the power source 72 to the light source LS, and the ultraviolet light is emitted from the light source LS. The ultraviolet light is transmitted through the irradiation window 740 of the light source chamber 520 and the transmission window 54 of the wafer chamber 510 and applied to the surface of the wafer W in the inert gas atmosphere. Since the dose amount required for exposure of the film of PS-b-PMMA is decided by "illuminance×irradiation time," it is preferable to decide an irradiation time according to the illuminance of the ultraviolet light through, for example, a preparatory experiment or the like.

Figure 11:
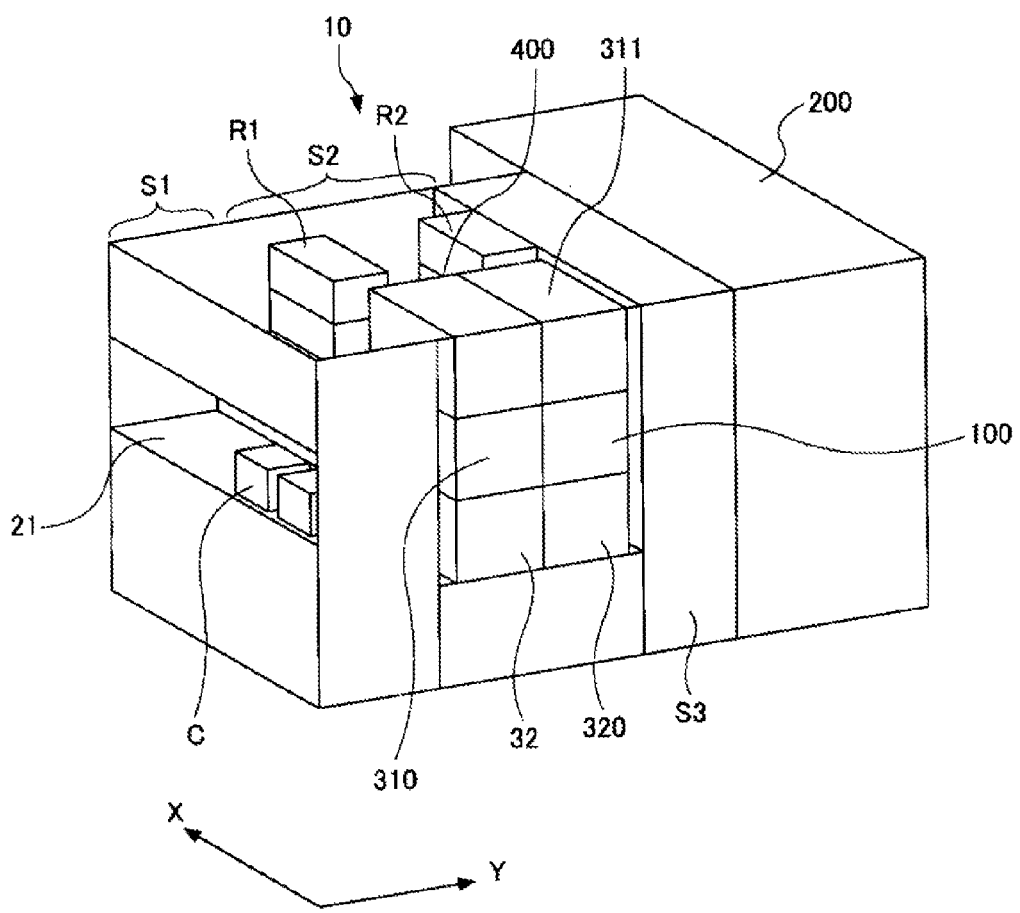
FIG. 11 A schematic perspective view illustrating a pattern forming apparatus in which the photoresist treatment apparatus illustrated in FIG. 6, the solution treatment apparatus illustrated in FIG. 9 and the ultraviolet light irradiation apparatus illustrated in FIG. 10 are incorporated.
Figure 12:
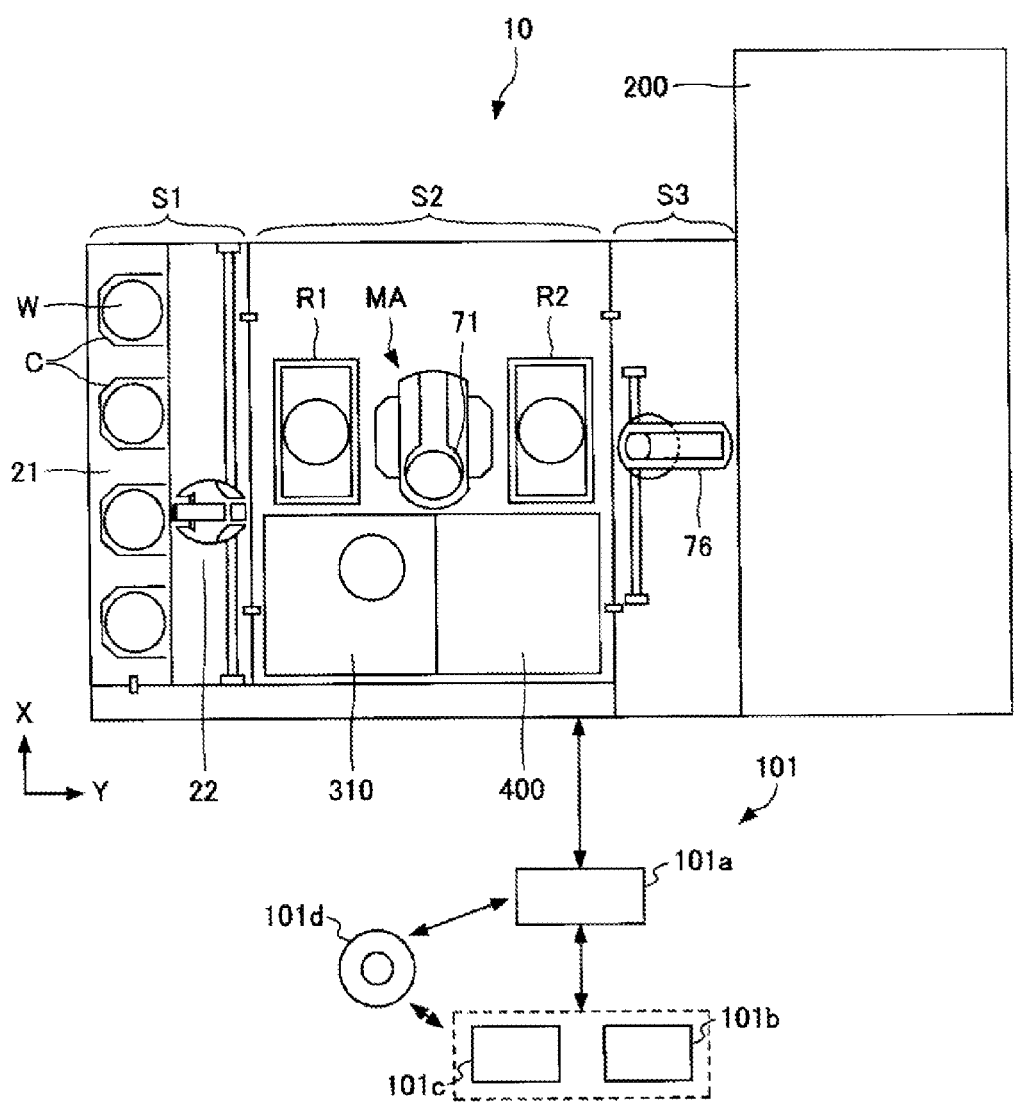
FIG. 12 A schematic top view illustrating the pattern forming apparatus illustrated in FIG. 11.

After the ultraviolet irradiation for the predetermined time, the wafer W is transferred out of the ultraviolet light irradiation apparatus 400 by the reverse procedure to that when the wafer W is transferred in. Thereafter, the wafer W is transferred to the BCP film treatment apparatus where an organic solvent (for example, IPA) is supplied to the film of PS-b-PMMA. This dissolves the PMMA polymer regions and thereby can obtain the pattern DP composed of the PS polymer regions. Next, the pattern forming apparatus in which the above-described photoresist treatment apparatus 100, BCP film forming apparatus 310, BCP film treatment apparatus, and ultraviolet light irradiation apparatus 400 are incorporated will be described referring to FIG. 11 to FIG. 13. FIG. 11 is a schematic perspective view illustrating a pattern forming apparatus 10 according to this embodiment. FIG. 12 is a schematic top view illustrating the pattern forming apparatus 10. Referring to FIG. 11 and FIG. 12, the pattern forming apparatus 10 has a cassette station S1, a treatment station S2, and an interface station S3.

In the cassette station S1, a cassette stage 21 and a transfer arm 22 (FIG. 12) are provided. On the cassette stage 21, a plurality of (for example, four) cassettes C each capable of housing a plurality of (for example, 25) wafers W are placed. In the following description, a direction in which the cassettes C are arranged side by side is an X-direction and a direction perpendicular thereto is a Y-direction for convenience. The transfer arm 22 is configured to be able to rise and lower, move in the X-direction, expand and contract in the Y-direction, and rotate around a vertical axis, so as to deliver the wafer W between the cassette C on the cassette stage 21 and the treatment station S2.

The treatment station S2 is coupled on a +Y-direction side to the cassette station S1. In the treatment station S2, a coating unit 32 that applies a photoresist onto the wafer W to form a photoresist film, a developing unit 320 that develops the photoresist film exposed in an exposure apparatus 200 are arranged along the Y-direction. Further, the BCP film forming apparatus 310 and the ultraviolet light irradiation apparatus 400 are arranged and stacked in this order on the coating unit 32, and the photoresist treatment apparatus 100 and a BCP film treatment apparatus 311 are arranged on the developing unit 320 (FIG. 11). Further, referring to FIG. 12, a shelf unit R1 is arranged on a +X-direction side with respect to the ultraviolet light irradiation apparatus 400, and a shelf unit R2 is arranged on the +X-direction side with respect to the BCP film treatment apparatus 311. In the shelf units R1 and R2, treatment units corresponding to the treatments performed on the wafer are stacked as will be described later.

At almost the center of the treatment station S2, a main transfer mechanism MA is provided as illustrated in FIG. 12, and the main transfer mechanism MA has an arm 71. The arm 71 is configured to be able to rise and lower, move in the X-direction and the Y-direction, and rotate around the vertical axis so as to transfer in/out the wafer W from/to the coating units 32, the developing unit 320, the BCP film forming apparatus 310, the photoresist treatment apparatus 100, the ultraviolet light irradiation apparatus 400, the BCP film treatment apparatus 311, and the treatment units in the shelf units R1 and R2.

Figure 13:
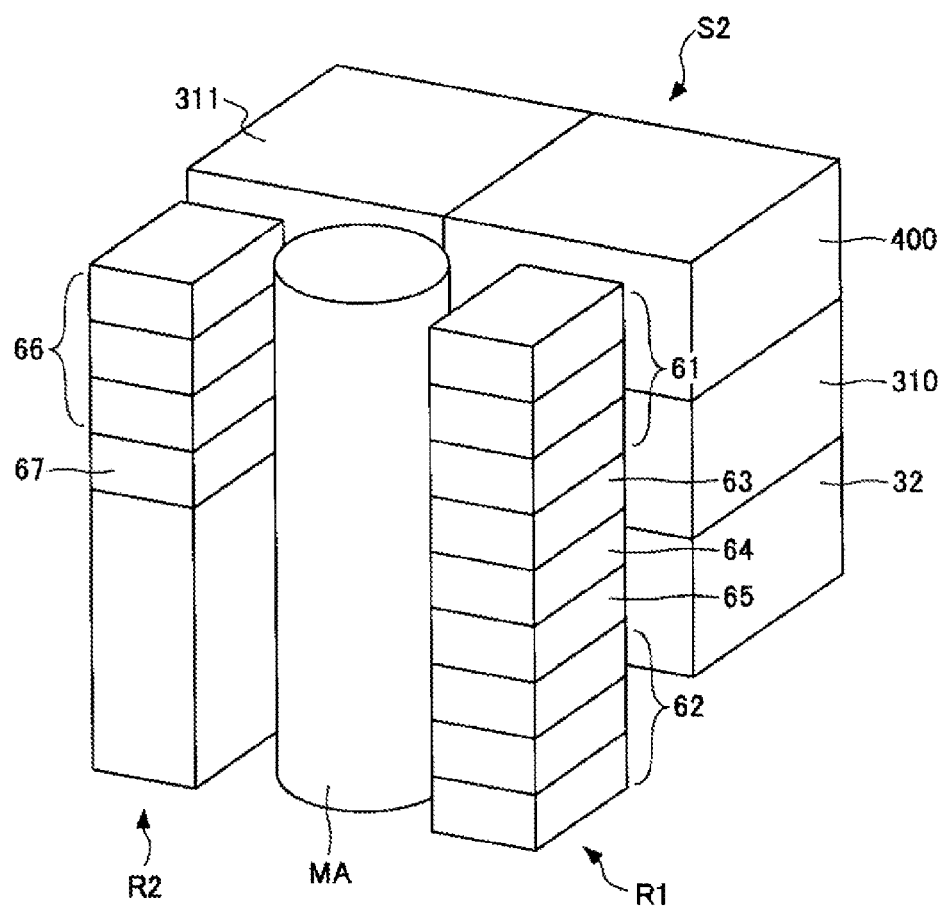
FIG. 13 A schematic perspective view illustrating a treatment station of the pattern forming apparatus illustrated in FIG. 11.

As illustrated in FIG. 13, in the shelf unit R1, heating units 61 each of which heats the wafer W, cooling units 62 each of which cools the wafer W, a hydrophobizing unit 63 which hydrophobizes the wafer surface, a pass unit 64 having a stage on which the wafer W is temporarily placed, an alignment unit 65 which aligns the wafer W and so on are arrayed in the vertical direction. Further, in the shelf unit R2, a plurality of CHP units 66 each of which heats and then cools the wafer W, a pass unit 67 having a stage on which the wafer W is temporarily placed and so on are arrayed in the vertical direction. Note that the kinds and arrays of the units in the shelf units R1 and R2 are not limited to those illustrated in FIG. 12 but may be variously changed.

Further, referring to FIG. 11 and FIG. 12, the interface station S3 is coupled to the +Y-direction side of the treatment station S2, and the exposure apparatus 200 is coupled to the +Y-direction side of the interface station S3.

Further, in the interface station S3, a transfer mechanism 76 (FIG. 12) is arranged. The transfer mechanism 76 is configured to be able to rise and lower, move in the X-direction, expand and contract in the Y-direction, and rotate around a vertical axis, so as to transfer in/out the wafer W between the pass unit 67 (FIG. 13) in the shelf unit R2 in the treatment station S2 and the exposure apparatus 200.

Further, in the pattern forming apparatus 10, a control unit 101 for controlling the operation of the whole apparatus is provided as illustrated in FIG. 12. In the control unit 101, a process controller 101a including a processor composed of a CPU (Central Processing Unit), an MPU (Micro Processing Unit) or the like to control components or members of the pattern forming apparatus 10, a user interface part 101b, and a storage part 101c are provided.

The user interface part 101b is composed of a keyboard through which a process manager performs input operation of commands for managing the pattern forming apparatus 10, a display that displays the operation status of the pattern forming apparatus 10, and so on.

The storage part 101c stores a control program (software) for realizing various treatments performed in the pattern forming apparatus 10 through control by the process controller 101a, and recipes in which treatment condition data and so on are stored. Then, an arbitrary recipe is called from the storage part 101c when necessary by the instruction from the user interface part 101b or the like and executed by the processor controller 101a, whereby a desired function is executed by the pattern forming apparatus 10 under control of the process controller 101a to perform a desired treatment. Namely, the program controls the computer to cause the pattern forming apparatus 10 to function as a means for performing, for example, the above-described pattern forming methods according to the embodiments of the present invention. Further, the program (and the recipe of treatment condition data and so on) has been stored in a computer-readable program storage medium 101d (for example, a hard disk, a compact disk, a magneto-optical disk, a memory card, a flexible disk or the like) and is installed into the storage part 101c through a predetermined input/output (I/O) apparatus (not illustrated). Alternatively, the program may be installed into the storage part 101c via, for example, a dedicated line from another apparatus such as a server apparatus.

According to the pattern forming apparatus 10 configured as described above, the pattern forming methods according to the first to third embodiments are executed under control of the control unit 101. Accordingly, the same effects as those achieved by the pattern forming methods in the first to third embodiments can be achieved by the pattern forming apparatus 10.

Though the present invention has been described with reference to the preferred embodiments of the present invention, the present invention is not limited to the above-described embodiments but can be variously changed and modified within the scope of the spirit of the present invention as set forth in accompanying claims.

For example, in the third embodiment, the hydrophilizing treatment of hydrophilizing the lines L of the photoresist pattern P is performed after the photoresist pattern smoothing step in the first embodiment is performed, but the hydrophilizing treatment may be performed subsequent to the photoresist pattern slimming step in the second embodiment.

Further, in the photoresist pattern forming step, an anti-reflection film may be formed on the wafer W before the photoresist film PR as illustrated in FIG. 1(a) is formed, and the photoresist film PR may be formed on the anti-reflection film.

Further, the first to third embodiments have been described taking as an example the photoresist pattern P having the lines L, namely, a line-and-space pattern, but it is obvious that even in the case of using a photoresist pattern including holes as a guide pattern, the inner surfaces of the holes are smoothed and/or hydrophilized, so that the pattern formation by PS-b-PMMA can be promoted.

Further, though hydrophilization of the surfaces of the lines L of the photoresist pattern P has been described in the third embodiment, the surfaces of the lines L may be hydrophobized. Hydrophobization is performed, for example, by exposing the lines L to a solution of a hydrophobizing agent such as a siliation agent or gas containing vapor of the solvent. Usable examples of the siliation agent include trimethylsilyl dimethylamine (TMSDMA), dimethylsilyl dimethylamine (DMSDMA), trimethylsilyl diethylamine (TMSDEA), hexamethyldisilazane (HMDS), and trimethyldisilazane (TMDS). By hydrophobizing the surfaces (side surfaces) of the lines L, a polymer having high affinity to a hydrophobized surface (the PS polymer in PS-b-PMMA) will be preferentially adsorbed to the lines L. For this reason, the PS polymer regions and the PMMA polymer regions are alternately arrayed in this order from the side surfaces of the lines L. Further, in the case of using the photoresist pattern including the holes as the guide pattern, cylinder-shaped portions are formed along the inner surfaces of the holes by the PS polymer, and pillar-shaped portions filling hollow portions of the cylinder-shaped portions are formed by the PMMA polymer. When the PS polymer (cylinder-shaped portions) is removed with an organic solvent such as IPA, the pillar-shaped portions remain. Such pillar-shaped portions can be preferably utilized for forming a three-dimensional memory and a three-dimensional transistor.

Further, examples of the block copolymer include, but not limited to PS-b-PMMA which has been exemplified in the above embodiments, polybutadiene-polydimethylsiloxane, polybutadiene-4-vinylpyridine, polybutadiene-methylmethacrylate, polybutadiene-poly-t-butylmethacrylate, polybutadiene-t-butylacrylate, poly-t-butylmethacrylate-poly-4-vinylpyridine, polyethylene-polymethylmethacrylate, poly-t-butylmethacrylate-poly-2-vinylpyridine, polyethylene-poly-2-vinylpyridine, polyethylene-poly-4-vinylpyridine, polyisoprene-poly-2-vinylpyridine, polymethylmethacrylate-polystyrene, poly-t-butylmethacrylate-polystyrene, polymethylacrylate-polystyrene, polybutadiene-polystyrene, polyisoprene-polystyrene, polystyrene-poly-2-vinylpyridine, polystyrene-poly-4-vinylpyridine, polystyrene-polydimethylsiloxane, polystyrene-poly-N,N-dimethylacrylamide, polybutadiene-sodium polyacrylate, polybutadiene-polyethyleneoxide, poly-t-butylmethacrylate-polyethyleneoxide, polystyrene-polyacrylic acid, polystyrene-polymethacrylic acid and so on.

Further, usable examples of the organic solvent that dissolves the PMMA polymer regions in the film of PS-b-PMMA include, but not limited to IPA, a mixed solution of IPA and methyl isobutyl ketone (MIBK) or acetic acid. Note that it is preferable to use IPA as the organic solvent in the case of using the photoresist pattern as the guide pattern. This is because the photoresist hardly dissolves in IPA.

Further, in the case of dissolving the PMMA polymer regions in the film of PS-b-PMMA with the organic solvent, the organic solvent may be increased in temperature depending on the organic solvent in use. In the case of IPA, it is preferable to increase it to a temperature of, for example, 40° C. to 60° C. The increase in temperature can increase the solubility of the PMMA polymer regions in the organic solvent.

Further, removal of the PMMA polymer regions in the film of PS-b-PMMA is performed not only by dissolution with the organic solvent, but may be performed by dry etching using, for example, oxygen plasma.

Though the Xe excimer lamp emitting ultraviolet light with a wavelength of 172 nm as the light source LS of the ultraviolet light is exemplified in the above embodiments, for example, a low-pressure ultraviolet lamp (low-pressure mercury lamp) that emits ultraviolet light having high peaks at a wavelength of 185 nm and a wavelength of 254 nm, or a KrCl excimer lamp that emits single wavelength light with a wavelength of 222 nm may be used. Further, the light source LS may be composed of a lamp having an emission spectrum that is comparatively broad, for example, from a far ultraviolet region to a vacuum ultraviolet region, and a wavelength cut filter cutting, for example, a wavelength longer than a wavelength of about 230 nm.

EXPLANATION OF CODES 100 photoresist treatment apparatus
69 lamp house
69L lamp
83 solvent supply nozzle
87 solvent gas supply source
310 BCP film forming apparatus
5 supply nozzle
39 supply source
400 ultraviolet light irradiation apparatus
510 wafer chamber
520 light source chamber
57 susceptor
58 support pin
LS light source
72 power source
10 pattern forming apparatus
S1 cassette station
S2 treatment station
S3 interface station
32 coating unit
320 developing unit
200 exposure apparatus
101 control unit
101*d* program storage medium

What is claimed:
1. A pattern forming method comprising the steps of:
forming a photoresist film on a substrate;
patterning the photoresist film to form a photoresist pattern;
smoothing a surface of the photoresist pattern;
after the step of smoothing, performing a predetermined surface treatment on the photoresist pattern;
applying a block copolymer containing at least two kinds of polymers to the substrate on which the photoresist pattern has been smoothed, to form a film of the block copolymer;
heating the substrate on which the film has been formed;
selectively removing one of the at least two kinds of polymers;
wherein the surface treatment is a hydrophilizing treatment of hydrophilizing the photoresist pattern,
wherein the hydrophilizing treatment comprises the step of irradiating the photoresist pattern with ultraviolet light under an air atmosphere to hydrophilize the photoresist pattern with the active oxygen generated by the ultraviolet light.
2. The pattern forming method according to claim 1, wherein the step of smoothing comprises the steps of:
supplying a solvent having solubility to the photoresist pattern; and
heating the photoresist pattern which has been supplied with the solvent.
3. The pattern forming method according to claim 1, wherein the step of smoothing comprises the steps of:
supplying an acid solution to the photoresist pattern;
heating the photoresist pattern which has been supplied with the acid solution, to form a soluble layer on the surface of the photoresist pattern; and
dissolving the soluble layer.
4. The pattern forming method according to claim 1, further comprising the step of:

subsequent to the step of heating, irradiating the film with ultraviolet light, wherein in the step of removing, the at least two kinds of polymers in the film which has been irradiated with the ultraviolet light are selectively dissolved.

5. A pattern forming method comprising the steps of:

forming a photoresist film on a substrate;

patterning the photoresist film to form a photoresist pattern;

smoothing a surface of the photoresist pattern;

after the step of smoothing, performing a predetermined surface treatment on the photoresist pattern;

applying a block copolymer containing at least two kinds of polymers to the substrate on which the photoresist pattern has been smoothed, to form a film of the block copolymer;

heating the substrate on which the film has been formed; and selectively removing one of the at least two kinds of polymers;

wherein the surface treatment is a hydrophilizing treatment of hydrophilizing the photoresist pattern, wherein the hydrophilizing treatment comprises the step of supplying a solution of a silane coupling agent to the photoresist pattern.

6. The pattern forming method according to claim 5, wherein the step of smoothing comprises the steps of:

supplying a solvent having solubility to the photoresist pattern; and heating the photoresist pattern which has been supplied with the solvent.

7. The pattern forming method according to claim 5, wherein the step of smoothing comprises the steps of:

supplying an acid solution to the photoresist pattern;

heating the photoresist pattern which has been supplied with the acid solution, to form a soluble layer on the surface of the photoresist pattern; and dissolving the soluble layer.

8. The pattern forming method according to claim 5, further comprising the step of:

subsequent to the step of heating, irradiating the film with ultraviolet light, wherein in the step of removing, the at least two kinds of polymers in the film which has been irradiated with the ultraviolet light are selectively dissolved.

* * * * *